United States Patent
Cho et al.

(10) Patent No.: US 7,236,012 B2
(45) Date of Patent: Jun. 26, 2007

(54) DATA OUTPUT DRIVER THAT CONTROLS SLEW RATE OF OUTPUT SIGNAL ACCORDING TO BIT ORGANIZATION

(75) Inventors: Geun-hee Cho, Suwon-si (KR); Jung-bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 10/970,016

(22) Filed: Oct. 22, 2004

(65) Prior Publication Data
US 2005/0105294 A1   May 19, 2005

(30) Foreign Application Priority Data
Nov. 17, 2003   (KR) .................. 10-2003-0081100

(51) Int. Cl.
*H03K 19/0175* (2006.01)
(52) U.S. Cl. .......................................... 326/83; 326/86
(58) Field of Classification Search ............. 326/83–90
See application file for complete search history.

(56) References Cited

U.S. PATENT DOCUMENTS

| | | | |
|---|---|---|---|
| 5,134,311 A * | 7/1992 | Biber et al. ................. 327/108 |
| 5,663,664 A | 9/1997 | Schnizlein |
| 5,917,758 A * | 6/1999 | Keeth ..................... 365/189.05 |
| 6,362,656 B2 * | 3/2002 | Rhee ............................ 326/87 |
| 6,384,621 B1 * | 5/2002 | Gibbs et al. .................. 326/30 |
| 6,538,464 B2 * | 3/2003 | Muljono et al. ............... 326/27 |
| 6,812,734 B1 * | 11/2004 | Shumarayev et al. ......... 326/30 |

FOREIGN PATENT DOCUMENTS

| KR | P1999-007298 | 1/1999 |
|---|---|---|
| KR | P1999-0064992 | 8/1999 |
| KR | 100414751 B1 | 12/2003 |

* cited by examiner

*Primary Examiner*—Don Le
(74) *Attorney, Agent, or Firm*—Volentine & Whitt, PLLC

(57) ABSTRACT

A data output driver of a semiconductor memory device can minimize a difference in slew rate of an output signal according to a selected bit organization. The data output driver includes a pull-up driver and a pull-down driver. The pull-up driver pulls up an output terminal and the pull-down driver pulls down the output terminal. In particular, current driving capabilities of the pull-up driver and/or the pull-down driver are changed in response to bit organization information signals of the semiconductor memory device.

17 Claims, 2 Drawing Sheets

DATA OUTPUT DRIVER THAT CONTROLS SLEW RATE OF OUTPUT SIGNAL ACCORDING TO BIT ORGANIZATION

CROSS REFERENCES TO RELATED APPLICATIONS

This application claims priority under 35 U.S.C. § 119 from Korean Patent Application No. 2003-81100, filed on Nov. 17, 2003, the contents of which are hereby incorporated by reference in their entirety for all purposes as if fully set forth herein.

BACKGROUND AND SUMMARY

1. Technical Field

The present invention relates to a semiconductor memory device, and more particularly, to an output driver of a semiconductor memory device.

2. Description of the Related Art

The bit organization, i.e., the number of bits of data that are output simultaneously, of a semiconductor memory device such as an asynchronous dynamic random access memory (ASDRAM), RAMBUS DRAM, is determined by the chip design. In other words, the bit organization is selected from among various bit organizations, such as X4, X8, and X16, in designing the chip, and internal circuits are designed according to the selected bit organization In contrast, in the case of a double data rate (DDR) synchronous DRAM (SDRAM), after several different bit organizations are installed in one chip in the chip design, and one bit organization is later set by bonding wire connection(s) in the manufacturing process. In other words, a bit organization of X4, X8, or X16 is selected according to a bonding wire connection state.

However, one of issues arising when several bit organizations are installed in one chip in a DDR SDRAM is that the slew rate of a signal output from a data output driver depends on the bit configuration. The slew rate generally indicates the amount of change in a voltage of a signal per unit time and is often referred to as a rise time or a fall time.

FIG. 1 illustrates a configuration of a data output driver in a DDR SDRAM. As described above, in the case of a DDR SDRAM, several bit organizations are installed in one chip in the chip design. Therefore, all bit organizations, such as X4, X8, X16, and the like should be considered in a designing process, and thus sixteen data output drivers 1 through 16 are divided into 6 or 7 groups in which each group includes 2 or 3 data output drivers as shown in FIG. 1, and a power line, i.e. a supply voltage line VDDQ, and a ground voltage line VSSQ are connected to each group.

In this case, all of the sixteen data output drivers 1 through 16 are used in a X16 product, while only 4 data output drivers are used in a X4 product (when the data output drivers 1 through 16 are grouped into 4 groups). Thus, the X4 product has VDDQ/VSSQ power characteristics that are superior to that of the X16 product. As a result, the slew rate of a signal output from a data output driver in the X4 product is greater than in the X16 product. Namely, in general, the slew rate of a signal output from a data output driver in a X8 product is greater than in the X16 product and the slew rate in the X4 product is greater than in the X8 product.

However, during the designing process, as mentioned above, several bit organizations are optionally designed in one chip and the slew rate of a data output driver is fit into one of the bit organizations. For this reason, in the remaining bit organizations, the slew rate of a data output driver falls outside the optimum point. In other words, when several bit organizations are installed in one chip, the slew rate of a signal output from a data output driver changes with a bit organization.

Accordingly, it would be desirable to provide a data output driver of a semiconductor memory device which minimizes a difference in slew rate of an output signal according to a selected bit organization.

According to one aspect of the present invention, a data output driver of a semiconductor memory device, which drives an output terminal, comprises: a pull-up driver, which pulls up the output terminal; and a pull-down driver, which pulls down the output terminal, wherein current driving capabilities of at least one of the pull-up driver and/or the pull-down driver are changed in response to a selected bit organization of the semiconductor memory device.

The pull-up driver may include a pull-up transistor, which is controlled by a pull-up driving signal and is connected between a supply voltage and the output terminal; and a logic gate, which inverts data and generates the pull-up driving signal, wherein a current driving capability of the logic gate is changed in response to the selected bit organization.

The pull-down driver may include a pull-down transistor, which is controlled by a pull-down driving signal and is connected between the output terminal and a ground voltage; and a logic gate, which inverts data and generates the pull-down driving signal, wherein a current driving capability of the logic gate is changed in response to the selected bit organization.

BRIEF DESCRIPTION OF THE DRAWINGS

The above and other aspects and advantages of the present invention will become more apparent by describing in detail an exemplary embodiment thereof with reference to the attached drawings in which.

DETAILED DESCRIPTION

Figure 1:
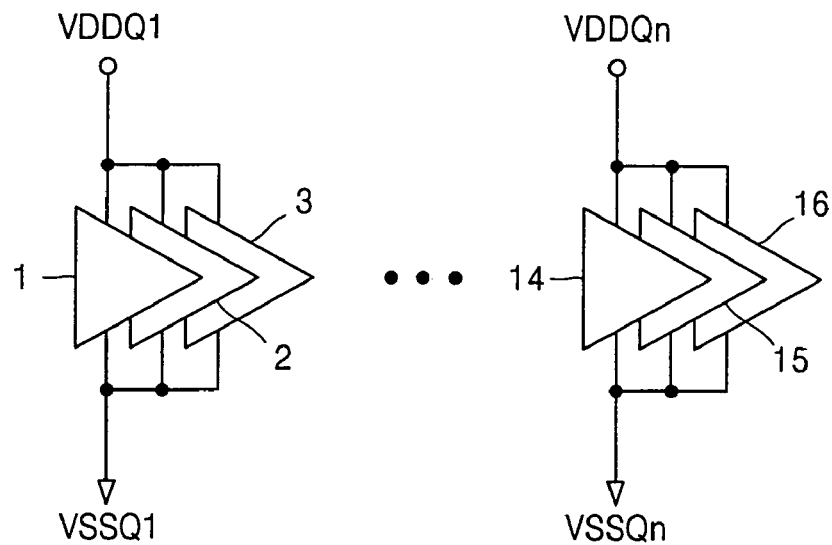
FIG. 1 illustrates an exemplary configuration of a conventional data output driver in DDR SDRAM.

The present invention will now be described more fully with reference to the accompanying drawings, in which an embodiment of the invention is shown. Throughout the drawings, like reference numerals are used to refer to like elements.

Figure 2:
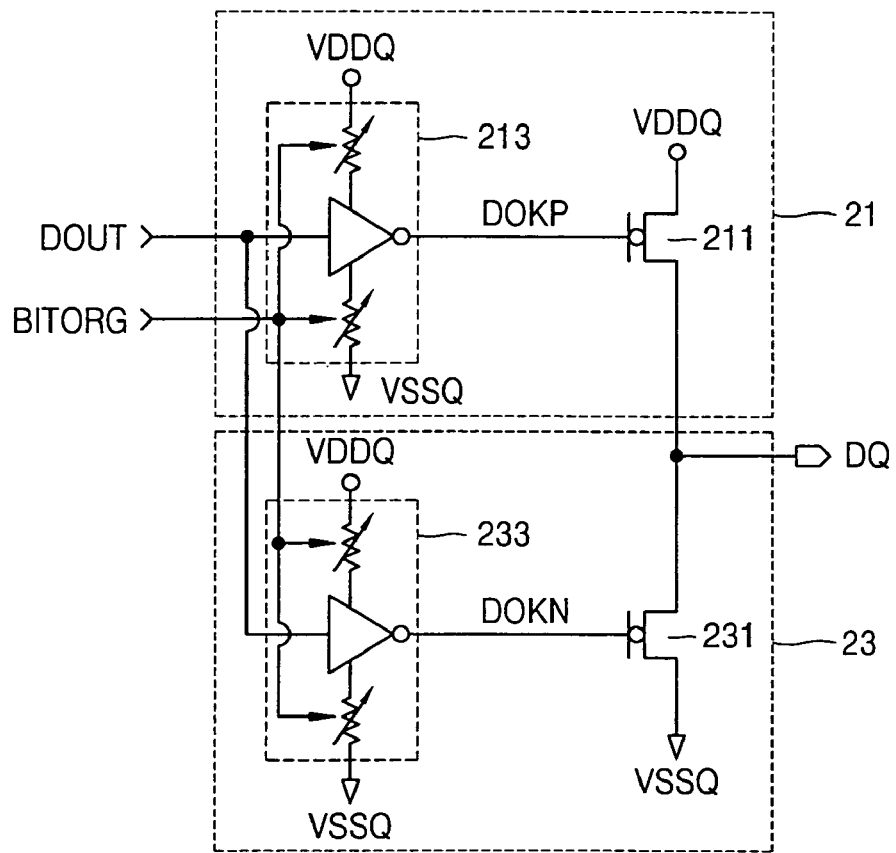
FIG. 2 is a circuit diagram of an embodiment of a data output driver according to one or more aspects of the present invention.

FIG. 2 is a circuit diagram of a data output driver according to one or more aspects of the present invention.

Referring to FIG. 2, the data output driver includes a pull-up driver 21 that pulls up an output terminal DQ and a pull-down driver 23 that pulls down the output terminal DQ. In particular, in the data output driver, a variable resistor that is gated by bit organization information signals BITORG of a semiconductor memory device is formed in a pull-up path and a pull-down path. Thus, strengths of the pull-up path and the pull-down path change with a bit organization and the slew rate of a signal output from the output terminal DQ is controlled.

In other words, current driving capabilities of the pull-up driver 21 and the pull-down driver 23 are changed in response to the bit organization information signals BITORG so that the skew rate of the signal output from the output terminal DQ is controlled.

More specifically, the pull-up driver 21 includes a pull-up transistor 211 and a logic gate 213. The pull-up transistor 211 is controlled by a pull-up driving signal DOKP and connected between a supply voltage VDDQ and the output terminal DQ. The logic gate 213 inverts output data DOUT and generates the pull-up driving signal DOKP. Here, a current driving capability of the logic gate 213 is changed in response to the bit organization information signals BITORG.

The pull-down driver 23 includes a pull-down transistor 231 and a logic gate 233. The pull-down transistor 231 is controlled by a pull-down driving signal DOKN and connected between the output terminal DQ and a ground voltage VSSQ. The logic gate 233 inverts the output data DOUT and generates the pull-down driving signal DOKN. Here, a current driving capability of the logic gate 233 is changed in response to the bit organization information signals BITORG.

Here, the data output driver is configured such that the current driving capabilities of both the pull-up driver 21 and the pull-down driver 23 are changed. However, if necessary, the data output driver may be configured such that the current driving capability of one of the pull-up driver 21 and the pull-down driver 23 is changed.

Figure 3:
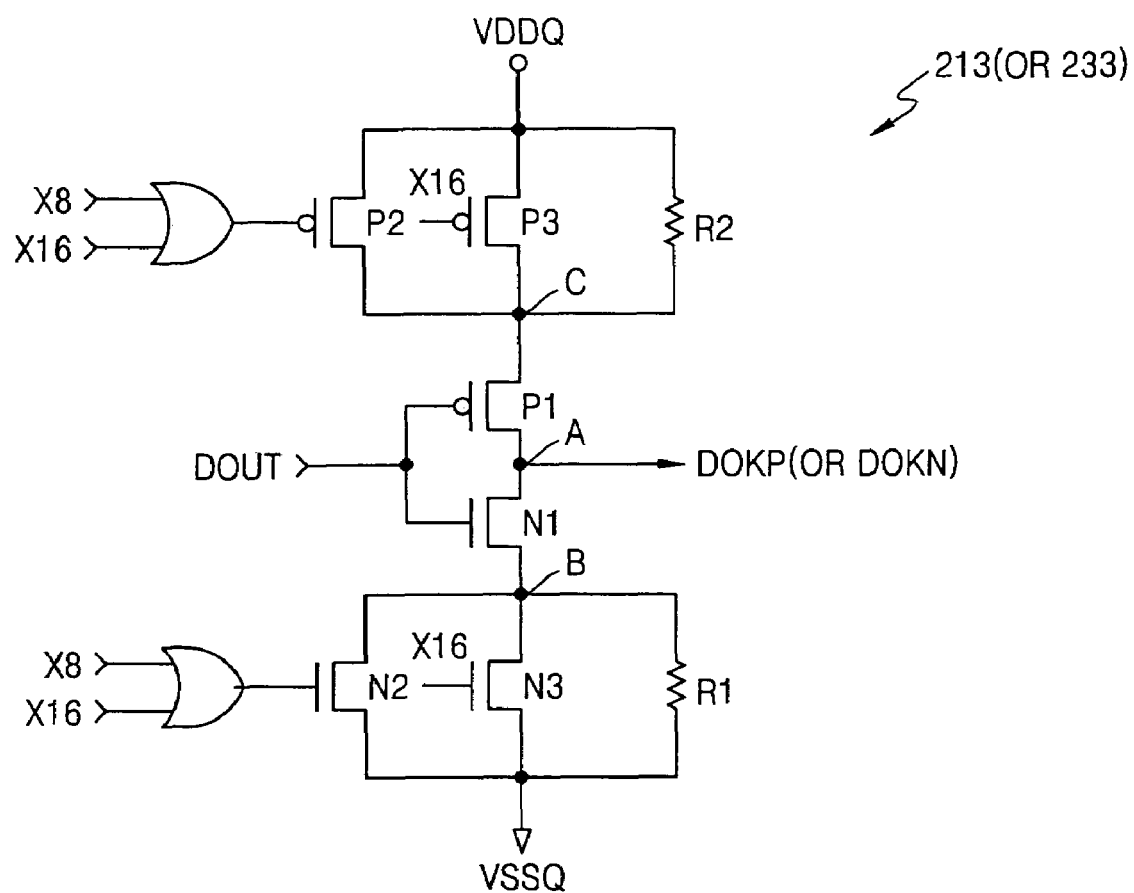
FIG. 3 is a detailed circuit diagram of a logic gate shown in FIG. 2.

FIG. 3 is a detailed circuit diagram of the logic gate 213 or 233 shown in FIG. 2.

Referring to FIG. 3, the logic gate 213 or 233 includes PMOS transistors P1, P2, and P3, NMOS transistors N1, N2, and N3, and resistors R1 and R2. If necessary, the logic gate 213 or 233 may not include the PMOS transistors P2 and P3 and the resistor R2, or the NMOS transistors N2 and N3 and the resistor R1.

The NMOS transistor N1 is connected between a node A and an internal node B and is gated by the output data DOUT. The pull-up driving signal DOKP (or the pull-down driving signal DOKN) is output from the node A. The resistor R1 is connected between the internal node B and the ground voltage VSSQ. The NMOS transistors N2 and N3 are connected between the internal node B and the ground voltage VSSQ and are gated by bit organization information signals X8 and X16.

The PMOS transistor P1 is connected to the node A and an internal node C and is gated by the output data DOUT. The second resistor R2 is connected between the internal node C and the supply voltage VDDQ. The PMOS transistors P2 and P3 are connected between the internal node C and the supply voltage VDDQ and are gated by the bit organization information signals X8 and X16.

Here, the bit organization information signal X8 indicates that the bit organization of the semiconductor memory device is 8 bits and the bit organization information signal X16 indicates that the bit organization of the semiconductor memory device is 16 bits.

Hereinafter, the operation of the logic gate 213 or 233 of FIG. 3 will be described in detail. For convenience of explanation, only the pull-down path will be explained.

When the bit organization is X4, the bit organization information signals X8 and X16 go low. As a result, the NMOS transistors N2 and N3 are turned off. Since only the resistor R1 is included in the pull-down path, the strength of the pull-down path decreases. In other words, the current driving capability of the pull-down path of the logic gate 213 or 233 is weakened.

When the bit organization is X8, the bit organization information signal X8 goes high and the bit organization information signal X16 goes low. As a result, the NMOS transistor N2 is turned on and the NMOS transistor N3 is turned off. Since the a turn-on resistance of the NMOS transistor N2 and the resistor R1 are connected in parallel between the node B and the ground voltage VSS, the strength of the pull-down path increases in comparison to in the bit organization X4. In other words, the current driving capability of the pull-down path of the logic gate 213 or 233 becomes stronger.

When the bit organization is X16, the bit organization information signal X8 goes low and the bit organization information signal X16 goes high. As a result, the NMOS transistor N2 and the NMOS transistor N3 are turned on. Since the turn-on resistance of the NMOS transistor N2, a turn-on resistance of the NMOS transistor N3, and the resistor R1 are connected in parallel between the node B and the ground voltage VSS, the strength of the pull-down path increases in comparison to in the bit organization X8. In other words, the current driving capability of the pull-down path of the logic gate 213 or 233 becomes stronger.

As pointed above, in general, the slew rate of a signal output from the data output driver in X8 is greater than in X16 and the slew rate in X4 is greater than in X8. In other words, when a number of bit organizations are installed in one chip, the slew rate of the signal output from the data output driver changes with a bit organization.

However, in the data output driver according to FIGS. 2 and 3, the current driving capability of the pull-down path of the logic gate 213 or 233 in X8 becomes greater than in X4 and the current driving capability in X16 becomes greater than in X8. As a result, even when a number of different bit organizations are installed in one chip, a difference in slew rate of the signal output from the data output driver according to a selected bit organization can be minimized. For convenience of explanation, only the pull-down path is explained. However, an operation and effect similar to the pull-down path can be obtained with respect to the pull-up path.

As described above, since X4 products have VDDQ/VSSQ power characteristics that are superior to that of X16 products, the slew rate of the signal output from the data output driver in the X4 products is greater than in the X16 products. Thus, in the case of the X4 products, by reducing the number of VDDQ/VSSQ power pads connected during assembling of the semiconductor memory device, the slew rate can be controlled.

In other words, if the number of VDDQ/VSSQ power pads connected during assembling of the semiconductor memory device is reduced, the strengths of the pull-down path and pull-up path of the data output driver decrease, resulting in a decrease in the slew rate of a signal output from the data output driver. Consequently, it is possible to minimize a difference in slew rate of the signal output from the data output driver according to a selected bit organization.

As described above, the data output driver can minimize a difference in slew rate of the signal output from the data output driver according to a selected bit organization.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A data output driver of a semiconductor memory device, which drives an output terminal and comprises:
    a pull-up driver, which pulls up the output terminal; and
    a pull-down driver, which pulls down the output terminal,
    wherein current driving capabilities of at least one of the pull-up driver and/or the pull-down driver are changed in response to a selected bit organization among a plurality of available bit organizations of the semiconductor memory device.

2. The data output driver of claim 1, wherein the pull-up driver comprises:
    a pull-up transistor, which is controlled by a pull-up driving signal and is connected between a supply voltage and the output terminal; and
    a logic gate, which inverts input data and generates a pull-up driving signal,
    wherein a current driving capability of the logic gate is changed in response to the selected bit organization.

3. The data output driver of claim 2, wherein the pull-down driver comprises:
    a pull-down transistor, which is controlled by a pull-down driving signal and is connected between the output terminal and a ground voltage; and
    a second logic gate, which inverts the input data and generates the pull-down driving signal,
    wherein a current driving capability of the second logic gate is changed in response to the selected bit organization.

4. The data output driver of claim 1, wherein the pull-down driver comprises:
    a pull-down transistor, which is controlled by a pull-down driving signal and is connected between the output terminal and a ground voltage; and
    a logic gate, which inverts data and generates the pull-down driving signal,
    wherein a current driving capability of the logic gate is changed in response to the selected bit organization.

5. The data output driver of claim 1, wherein the at least one of the pull-up driver and the pull-down driver is adapted to receive at least one bit organization signal and to change its current driving capability in response to the at least one bit organization signal.

6. The data output driver of claim 5, wherein the pull-up driver comprises:
    a pull-up transistor, which is controlled by a pull-up driving signal and is connected between a supply voltage and the output terminal; and
    a logic gate, which inverts input data and generates a pull-up driving signal,
    wherein a current driving capability of the logic gate is changed in response to the at least one bit organization signal.

7. The data output driver of claim 6, wherein the logic gate comprises:
    a first PMOS transistor, which is connected between an output terminal of the logic gate and an internal node and is gated by input data;
    a resistor, which is connected between the internal node and the supply voltage; and
    at least one second PMOS transistor, which is connected between the internal node and the supply voltage and is gated by the bit organization information signals.

8. The data output driver of claim 7, wherein the logic gate further comprises:
    a first NMOS transistor, which is connected between the output terminal of the logic gate and a second internal node and is gated by the input data;
    a resistor, which is connected between the second internal node and a ground voltage; and
    at least one second NMOS transistor, which is connected between the second internal node and the ground voltage and is gated by the bit organization information signals.

9. The data output driver of claim 6, wherein the logic gate further comprises:
    a first NMOS transistor, which is connected between an output terminal of the logic gate and an internal node and is gated by input data;
    a resistor, which is connected between the internal node and a ground voltage; and
    at least one second NMOS transistor, which is connected between the internal node and the ground voltage and is gated by the bit organization information signals.

10. The data output driver of claim 6, wherein the pull-down driver comprises:
    a pull-down transistor, which is controlled by a pull-down driving signal and is connected between the output terminal and a ground voltage; and
    a second logic gate, which inverts data and generates the pull-down driving signal,
    wherein a current driving capability of the second logic gate is changed in response to the at least one bit organization signal.

11. The data output driver of claim 10, wherein the second logic gate comprises:
    a first PMOS transistor, which is connected between an output terminal of the second logic gate and is gated by input data;
    a resistor, which is connected between the internal node and a supply voltage; and
    at least one second PMOS transistor, which is connected between the internal node and the supply voltage and is gated by the bit organization information signals.

12. The data output driver of claim 11, wherein the second logic gate comprises:
    a first NMOS transistor, which is connected between the output terminal of the second logic gate and a second internal node and is gated by the input data;
    a resistor, which is connected between the second internal node and the ground voltage; and
    at least one second NMOS transistor, which is connected between the second internal node and the ground voltage and is gated by the bit organization information signals.

13. The data output driver of claim 10, wherein the second logic gate comprises:
    a first NMOS transistor, which is connected between an output terminal of the second logic gate and an internal node and is gated by input data;
    a resistor, which is connected between the internal node and the ground voltage; and
    at least one second NMOS transistor, which is connected between the internal node and the ground voltage and is gated by each of the bit organization information signals.

14. The data output driver of claim 5, wherein the pull-down driver comprises:
    a pull-down transistor, which is controlled by a pull-down driving signal and is connected between the output terminal and a ground voltage; and a logic gate, which inverts data and generates the pull-down driving signal, wherein a current driving capability of the logic gate is changed in response to the at least one bit organization signal.

15. The data output driver of claim 14, wherein the second logic gate comprises:

a first PMOS transistor, which is connected between an output terminal of the logic gate and is gated by input data;

a resistor, which is connected between the internal node and a supply voltage; and at least one second PMOS transistor, which is connected between the internal node and the supply voltage and is gated by the bit organization information signals.

16. The data output driver of claim 15, wherein the second logic gate comprises:

a first NMOS transistor, which is connected between the output terminal of the logic gate and a second internal node and is gated by the input data;

a resistor, which is connected between the second internal node and the ground voltage; and at least one second NMOS transistor, which is connected between the second internal node and the ground voltage and is gated by the bit organization information signals.

17. The data output driver of claim 14, wherein the logic gate comprises:

a first NMOS transistor, which is connected between an output terminal of the logic gate and an internal node and is gated by input data;

a resistor, which is connected between the internal node and the ground voltage; and at least one second NMOS transistor, which is connected between the internal node and the ground voltage and is gated by each of the bit organization information signals.

* * * * *